United States Patent
Yu

(10) Patent No.: US 10,568,237 B2
(45) Date of Patent: Feb. 18, 2020

(54) MOUNTING APPARATUS FOR FAN AND COOLING DEVICE USING THE SAME

(71) Applicant: HONGFUJIN PRECISION ELECTRONICS (TIANJIN) CO., LTD., Tianjin (CN)

(72) Inventor: Mo-Ming Yu, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 128 days.

(21) Appl. No.: 15/937,206

(22) Filed: Mar. 27, 2018

(65) Prior Publication Data

US 2019/0208670 A1 Jul. 4, 2019

(30) Foreign Application Priority Data

Dec. 29, 2017 (CN) .......................... 2017 1 1484772

(51) Int. Cl.
 *F04D 29/64* (2006.01)
 *F04D 29/52* (2006.01)
 *H05K 7/20* (2006.01)

(52) U.S. Cl.
 CPC ....... *H05K 7/20736* (2013.01); *F04D 29/522* (2013.01); *F04D 29/646* (2013.01)

(58) Field of Classification Search
 CPC .. F04D 29/522; F04D 29/646; H05K 7/20736
 See application file for complete search history.

(56) References Cited

U.S. PATENT DOCUMENTS

| | | | |
|---|---|---|---|
| 9,441,641 B1* | 9/2016 | Criswell | F04D 29/646 |
| 10,240,615 B1* | 3/2019 | Kho | F04D 29/668 |
| 2015/0351280 A1* | 12/2015 | Gonzalez Inda | H05K 7/20172 361/695 |
| 2018/0119701 A1* | 5/2018 | Yu | F04D 19/002 |

* cited by examiner

*Primary Examiner* — Woody A Lee, Jr.
(74) *Attorney, Agent, or Firm* — ScienBiziP, P.C.

(57) ABSTRACT

A mounting apparatus for an easily-demountable fan and cooling devices includes a fan housing for accommodating the fan and a locking unit rotatably installed to the fan housing. The locking unit is rotatable between a locking position and an unlocking position. The locking unit includes a locking portion. When the locking unit rotates to the locking position, the locking portion protrudes out of the fan housing for easy manual access, and when the locking unit rotates to the unlocking position, the locking portion is received in the fan housing.

16 Claims, 4 Drawing Sheets

300

MOUNTING APPARATUS FOR FAN AND COOLING DEVICE USING THE SAME

FIELD

The subject matter herein generally relates to mounting apparatus for fan and cooling devices using the mounting apparatus.

BACKGROUND

Many computers include fans to generate airflow for removing heat. Removing heat from a computer helps control internal temperatures, to maintain system reliability, performance, and longevity. Rack-mounted computers typically include several servers and other equipment in a high-density arrangement within a chassis. Space saving and easy maintenance of fans is needed.

BRIEF DESCRIPTION OF THE DRAWINGS

Implementations of the present disclosure will now be described, by way of example only, with reference to the attached figures.

DETAILED DESCRIPTION

Figure 1:
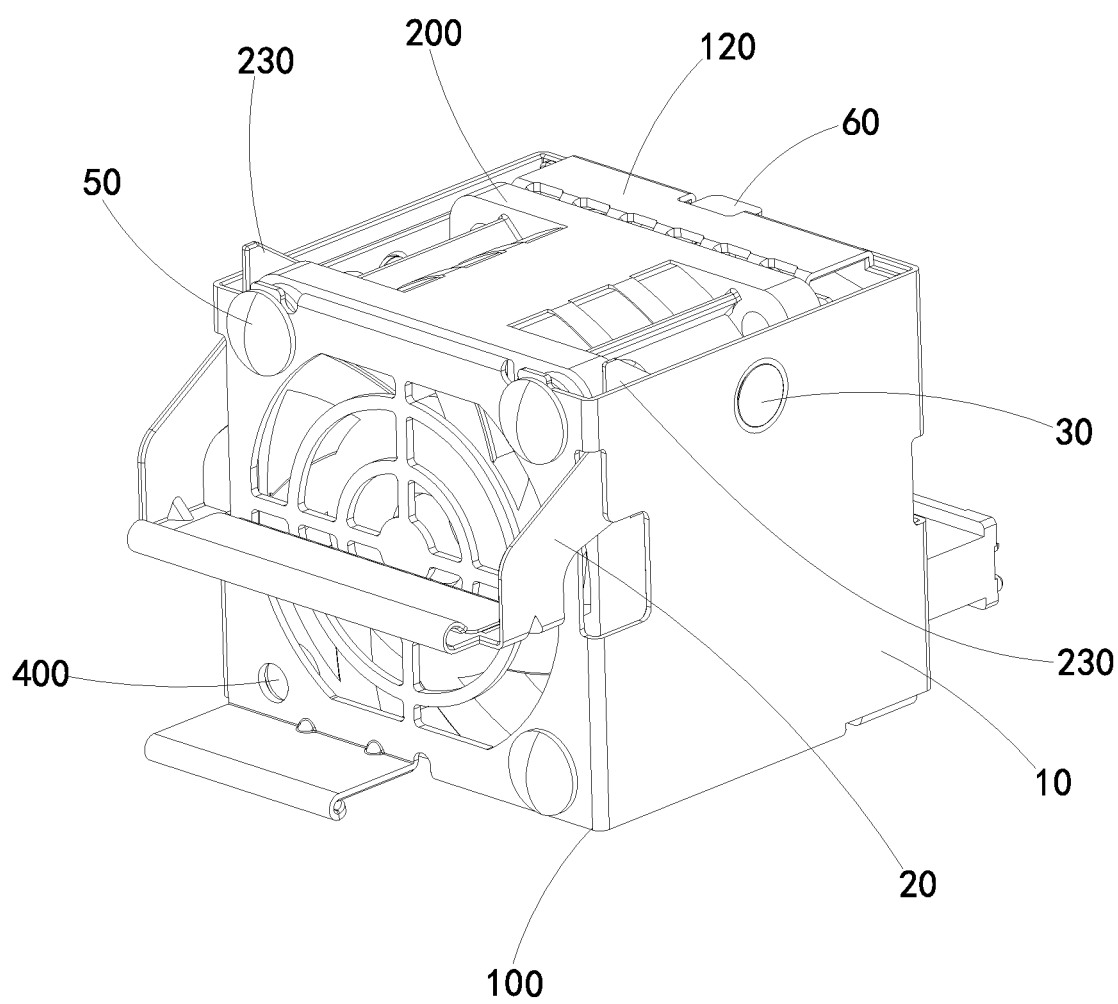
FIG. 1 illustrates an isometric view of an exemplary embodiment of a cooling device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
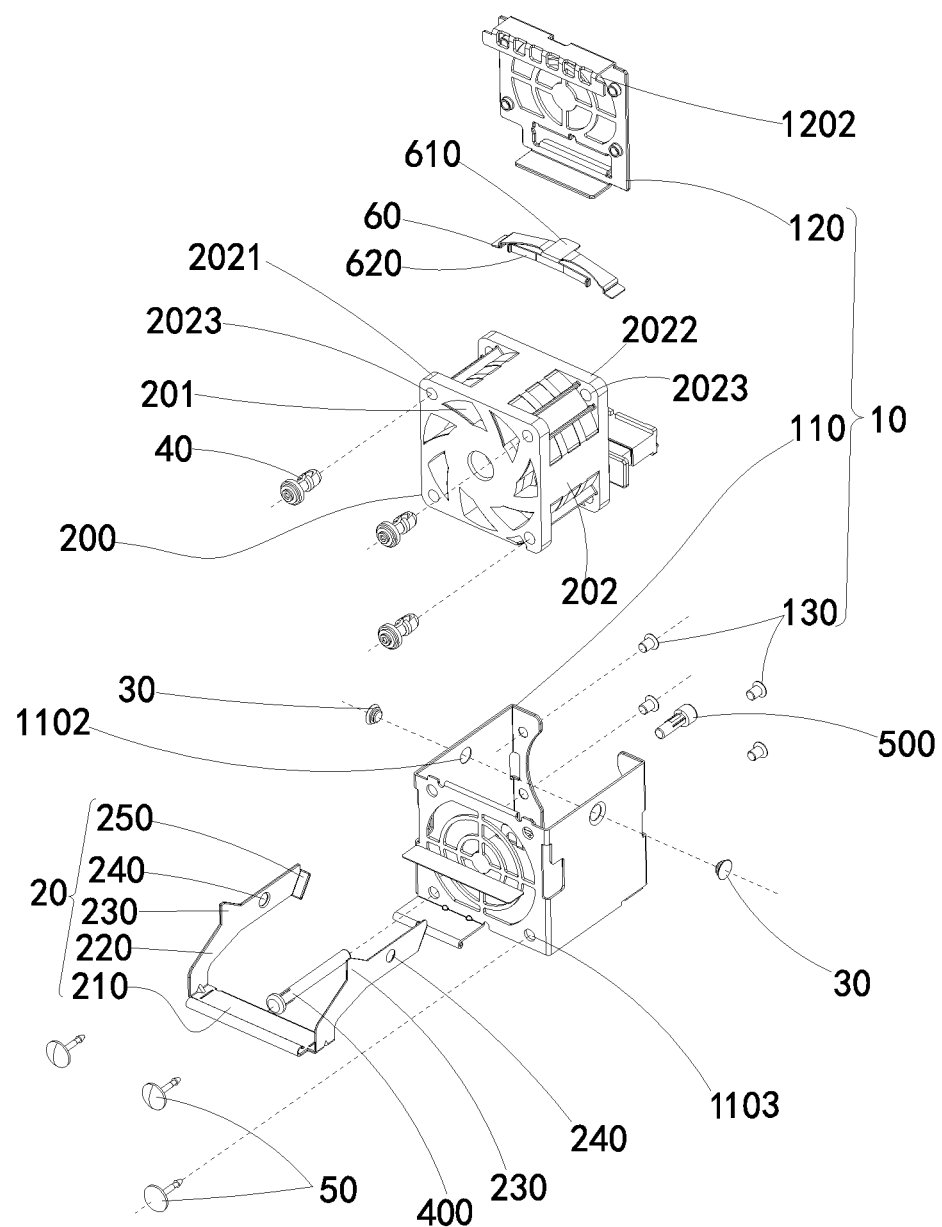
FIG. 2 illustrates an exploded view of the cooling device of FIG. 1.

FIGS. 1-2 illustrate a cooling device 300.

The cooling device 300 includes a fan 200 and a mounting apparatus 100 for the fan 200. The fan 200 can be accommodated and mounted in the mounting apparatus 100.

The mounting apparatus includes a fan housing 10 and a locking unit 20. The fan 200 can be accommodated in the fan housing 10. The fan housing 10 can define inlets and outlets corresponding to the fan 200.

Figure 3:
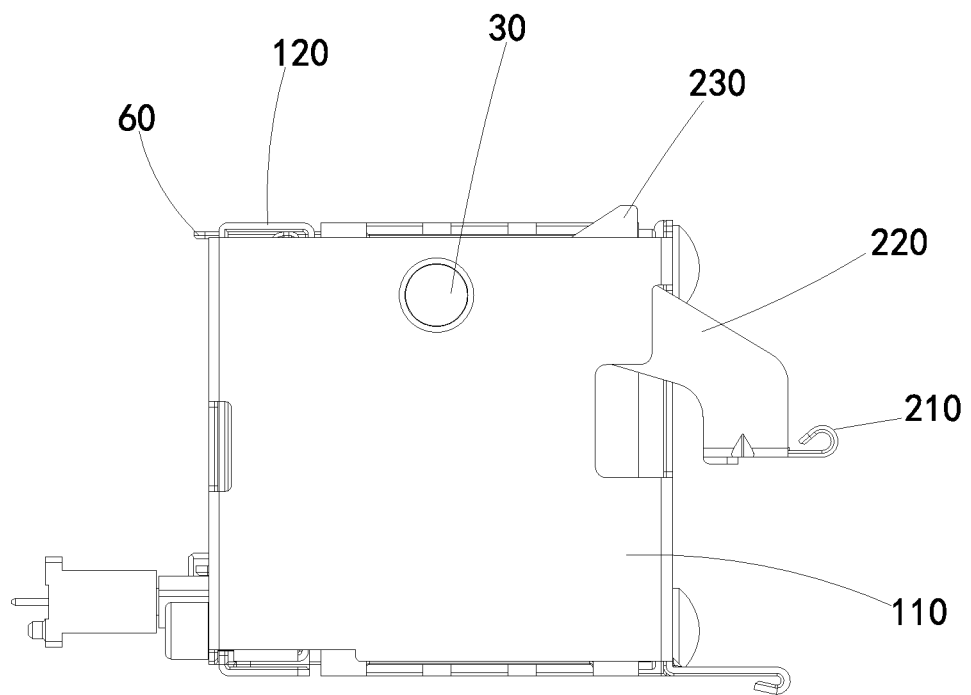
FIG. 3 illustrates an isometric view of the cooling device of FIG. 1, showing the mounting apparatus locked.
Figure 4:
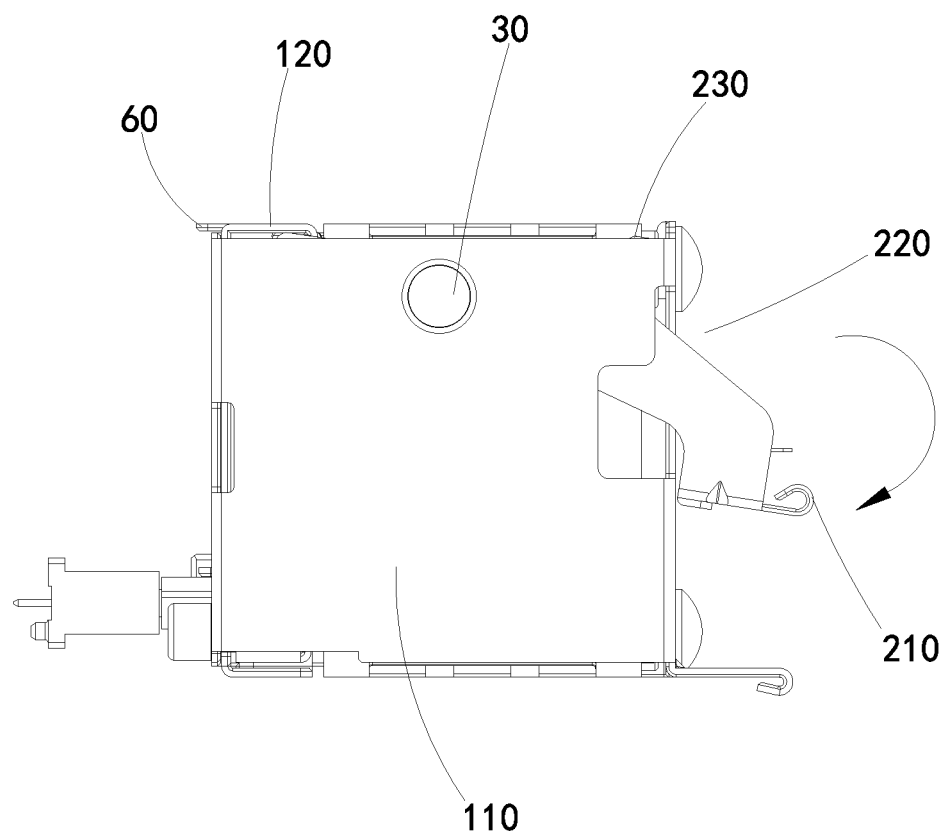
FIG. 4 illustrates an isometric view of the cooling device of FIG. 1, showing the mounting apparatus unlocked.

Referring to FIGS. 3-4, the locking unit 20 is rotatably installed to the fan housing 10. The locking unit 20 is rotatable between a locking position (shown in FIG. 3) and an unlocking position (shown in FIG. 4).

The locking unit 20 includes a locking portion 230.

When the locking unit 20 rotates to the locking position, the locking portion 230 protrudes out of the fan housing 10, and when the locking unit 20 rotates to the unlocking position, the locking portion 230 is received in the fan housing 10.

For example, the cooling device 300 can be slidably installed in and removed from a casing (not shown). When the cooling device 300 is installed in the casing, the locking unit 20 rotates to the locking position, the locking portion 230 protrudes out of the fan housing 10 and binds against the casing to lock the cooling device 300 in the casing. When the cooling device 300 is needed to be removed from the casing, the locking unit 20 can be rotated to the unlocking position, the locking portion 230 received in the fan housing 10 and the cooling device 300 is free to be removed.

In at least one exemplary embodiment, the mounting apparatus 100 can further include a resilient member 60. The resilient member 60 is connected between the locking unit 20 and the fan housing 10.

When the locking unit 20 is forced to rotate to the locking position, the resilient member 60 is elastically deformed. When the locking unit 20 is released, the locking portion 230 is driven to rotate to the unlocking position under restoring force of the resilient member 60.

The fan housing 10 can include a shell 110 and a cover 120. The cover 120 is mounted to the shell 110, and the cover 120 defines a receiving slot 1202.

The shell 110 defines an accommodating space. The resilient member 60 is received in the receiving slot 1202.

The locking unit 20 includes a cantilever 220, a handle 210, and a resisting portion 250.

The cantilever 220 includes two opposing ends. The handle 210 is connected to an end of the cantilever 220, and the resisting portion 250 is located at the other end of the cantilever 220.

The resisting portion 250 contacts the resilient member 60. The cantilever 220 is rotatably connected in the shell 110. The locking portion 230 is located at a peripheral side of the cantilever 220, and the handle 210 protrudes out of the shell 110.

When the handle 210 is pressed, the cantilever 220 rotates and drives the locking portion 230 to rotate to the unlocking position, the resisting portion 250 resists against the resilient member 60 and drives the resilient member 60 to be elastically deformed. When the handle 210 is released, the cantilever 220 rotates back under restoring force of the resilient member 60 and the locking portion 230 is driven back to the locking position.

The cantilever 220 can define a pivot hole 240. The mounting apparatus 100 can further include a pivot pin 30 corresponding to the pivot hole 240. The pivot pin 30 is fixed to the shell 110, and the cantilever 220 is rotatably connected to the shell 110 through the pivot pin 30 and the pivot hole 240.

The resilient member 60 can include a guiding portion 610 and an elastic sheet 620.

The guiding portion 610 is slidably received in the receiving slot 1202. The elastic sheet 620 is connected to a side of the guiding portion 610 and contacts the locking unit 20.

The mounting apparatus 100 can further include a plurality of backing rings 40 and screws 50 for mounting the fan 200 to the fan housing 10.

The fan 200 includes a bracket 202 and a plurality of fan blades 201. The fan blades 201 are pivotally installed to the bracket 202.

The bracket 202 includes a first mounting plate 2021 and a second mounting plate 2022 parallel with the first mounting plate 2021.

Each of the first mounting plate 2021 and the second mounting plate 2022 defines a plurality of first mounting holes 2023. The fan housing 10 defines a plurality of second mounting holes 1103 corresponding to the first mounting holes 2023. The bracket 202 is accommodated in the fan housing 10 and mounted to the fan housing 10 through the first mounting holes 2021, the second mounting holes 1103, and using screws 130.

The fan can further include a first light pipe 400 received in a second mounting hole 1103 and a second light pipe 500 received in a first mounting hole 2023.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A mounting apparatus for fan comprising:
   a fan housing for accommodating the fan; and
   a locking unit rotatably installed to the fan housing, and the locking unit is rotatable between a locking position and an unlocking position, wherein the locking unit comprises a locking portion;
   when the locking unit rotates to the locking position, the locking portion protrudes out of the fan housing; and when the locking unit rotates to the unlocking position, the locking portion is received in the fan housing.

2. The mounting apparatus of claim 1, wherein the mounting apparatus further comprises a resilient member connected between the locking unit and the fan housing;
   when the locking unit is forced to rotate to the locking position, the resilient member is elastically deformed; and when the locking unit is released, the locking portion is driven to rotate to the unlocking position under restoring force of the resilient member.

3. The mounting apparatus of claim 2, wherein the fan housing comprises:
   a shell defining an accommodating space; and
   a cover mounted to the shell and defines a receiving slot;
   wherein the resilient member is received in the receiving slot.

4. The mounting apparatus of claim 3, wherein the locking unit comprises:
   a cantilever comprising two opposing ends;
   a handle connected to an end of the cantilever; and
   a resisting portion located at the other end of the cantilever;
   wherein the resisting portion contacts with the resilient member; the cantilever is rotatably connected in the shell, the locking portion is located at a peripheral side of the cantilever, and the handle protrudes out of the shell;
   when the handle is forced, the cantilever rotates and drives the locking portion to rotate to the unlocking position, the resisting portion resists against the resilient member and drives the resilient member to elastically deformed; when the handle is released, the cantilever rotates backwards under restoring force of the resilient member and the locking portion is driven back to the locking position.

5. The mounting apparatus of claim 4, wherein the cantilever defines a pivot hole; the mounting apparatus further comprises a pivot pin corresponding to the pivot hole, the pivot pin is fixed to the shell, and the cantilever is rotatably connected to the shell through the pivot pin and the pivot hole.

6. The mounting apparatus of claim 3, wherein the resilient member comprises:
   a guiding portion slidably received in the receiving slot; and
   an elastic sheet connected to a side of the guiding portion and contacts with the locking unit.

7. The mounting apparatus of claim 1, wherein the mounting apparatus further comprises a plurality of backing rings and screws for mounting the fan to the fan housing.

8. A cooling device comprising:
   a fan; and
   a mounting apparatus for the fan, comprising:
      a fan housing for accommodating the fan; and
      a locking unit rotatably installed to the fan housing, and the locking unit is rotatable between a locking position and an unlocking position, wherein the locking unit comprises a locking portion;
      when the locking unit rotates to the locking position, the locking portion protrudes out of the fan housing; and when the locking unit rotates to the unlocking position, the locking portion is received in the fan housing.

9. The cooling device of claim 8, wherein the mounting apparatus further comprises a resilient member connected between the locking unit and the fan housing;
   when the locking unit is forced to rotate to the locking position, the resilient member is elastically deformed; and when the locking unit is released, the locking portion is driven to rotate to the unlocking position under restoring force of the resilient member.

10. The cooling device of claim 9, wherein the fan housing comprises:
    a shell defining an accommodating space; and
    a cover mounted to the shell and defines a receiving slot;
    wherein the resilient member is received in the receiving slot.

11. The cooling device of claim 10, wherein the locking unit comprises:
    a cantilever comprising two opposing ends;
    a handle connected to an end of the cantilever; and
    a resisting portion located at the other end of the cantilever;
    wherein the resisting portion contacts with the resilient member; the cantilever is rotatably connected in the shell, the locking portion is located at a peripheral side of the cantilever, and the handle protrudes out of the shell;
    when the handle is forced, the cantilever rotates and drives the locking portion to rotate to the unlocking position, the resisting portion resists against the resilient member and drives the resilient member to elastically deformed; when the handle is released, the cantilever rotates backwards under restoring force of the resilient member and the locking portion is driven back to the locking position.

12. The cooling device of claim 11, wherein the cantilever defines a pivot hole; the mounting apparatus further comprises a pivot pin corresponding to the pivot hole, the pivot pin is fixed to the shell, and the cantilever is rotatably connected to the shell through the pivot pin and the pivot hole.

13. The cooling device of claim 10, wherein the resilient member comprises:
   a guiding portion slidably received in the receiving slot; and
   an elastic sheet connected to a side of the guiding portion and contacts with the locking unit.

14. The cooling device of claim 8, wherein the mounting apparatus further comprises a plurality of backing rings and screws for mounting the fan to the fan housing.

15. The cooling device of claim 8, wherein the fan comprises:
   a bracket comprising:
      a first mounting plate; and
      a second mounting plate parallel with the first mounting plate; and
   a plurality of fan blades pivotally installed to the bracket;
   wherein each of the first mounting plate and the second mounting plate defines a plurality of first mounting holes; the fan housing defines a plurality of second mounting holes corresponding to the first mounting holes; the bracket is accommodated in the fan housing and mounted to the fan housing through the first mounting holes, the second mounting holes and screws.

16. The cooling device of claim 9, wherein the fan further comprises:
   a first light pipe received in a second mounting hole; and
   a second light pipe received in a first mounting hole.

\* \* \* \* \*